United States Patent
Narayanan et al.

(10) Patent No.: US 10,283,173 B2
(45) Date of Patent: May 7, 2019

(54) INTELLIGENT BACKUP CAPACITOR MANAGEMENT

(71) Applicant: Seagate Technology LLC, Cupertino, CA (US)

(72) Inventors: Sathish Narayanan, Tamilnadu (IN); Vinayak Vithalkar, Karnataka (IN); Eric Pius Pradeep, Tamilnadu (IN)

(73) Assignee: Seagate Technologies LLC, Cupertino, CA (US)

( * ) Notice: Subject to any disclaimer, the term of this patent is extended or adjusted under 35 U.S.C. 154(b) by 104 days.

(21) Appl. No.: 15/491,615

(22) Filed: Apr. 19, 2017

(65) Prior Publication Data

US 2018/0308527 A1    Oct. 25, 2018

(51) Int. Cl.
| | |
|---|---|
| *G06F 1/26* | (2006.01) |
| *G06F 1/30* | (2006.01) |
| *G06F 3/06* | (2006.01) |
| *G11C 5/14* | (2006.01) |

(52) U.S. Cl.
CPC ............... *G11C 5/141* (2013.01); *G06F 1/26* (2013.01); *G06F 1/30* (2013.01); *G06F 3/065* (2013.01); *G06F 3/0619* (2013.01); *G06F 3/0673* (2013.01); *G11C 5/148* (2013.01)

(58) Field of Classification Search
CPC . H02J 7/345; H02J 7/0068; H02J 9/06; G06F 1/30; G06F 3/0625; G06F 1/263; G06F 1/28; G06F 1/305; G06F 1/3225; G06F 2212/214; G11C 5/141; G01R 31/3679
See application file for complete search history.

(56) References Cited

U.S. PATENT DOCUMENTS

| | | | |
|---|---|---|---|
| 4,874,960 A | 10/1989 | Cybela et al. | |
| 5,710,504 A | 1/1998 | Pascual et al. | |
| 6,859,011 B2 | 2/2005 | Tscheternigg et al. | |
| 8,479,032 B2 | 7/2013 | Trantham et al. | |
| 8,719,629 B2 | 5/2014 | Wilson | |
| 2008/0235471 A1* | 9/2008 | Feldman | G06F 1/30 711/162 |
| 2010/0332862 A1* | 12/2010 | Lester | G06F 1/30 713/300 |
| 2012/0293012 A1* | 11/2012 | Kumar | H02M 3/06 307/109 |
| 2014/0380067 A1* | 12/2014 | Laird | G06F 1/263 713/300 |
| 2015/0270743 A1* | 9/2015 | Orthlieb | H02J 3/00 165/288 |
| 2017/0139626 A1* | 5/2017 | Wakchaure | G11C 11/5628 |

* cited by examiner

*Primary Examiner* — Terrell S Johnson
(74) *Attorney, Agent, or Firm* — Taylor English Duma LLP

(57) ABSTRACT

Methods and apparatuses for intelligently managing backup capacitors in a storage device. The power consumption of the device is monitored in order to determine a current backup energy requirement comprising an amount of energy needed to power the device for data-backup and power-down operations in the event of an interruption of main power to the device. Based on the current backup energy requirement, one or more of a plurality of backup capacitors of the device are turned on or off, wherein the plurality of backup capacitors are configured such that those of the plurality of backup capacitors remaining in the on state provide backup energy to the device during the interruption of main power.

20 Claims, 3 Drawing Sheets

BACKUP CAP MANAGEMENT PARAMETERS _232_

- BACKUP ENERGY REQ. THRESHOLD _302A_
- BACKUP ENERGY REQ. THRESHOLD _302B_
- ...
- BACKUP ENERGY REQ. THRESHOLD _302N_
- BACKUP CAP ROTATION SCHEDULE _304_
- ...

*FIG. 3*

INTELLIGENT BACKUP CAPACITOR MANAGEMENT

BRIEF SUMMARY

The present disclosure relates to methods, systems, and apparatuses for intelligently managing backup capacitors in a storage device in order to prolong capacitor life. According to some embodiments, a method comprises steps of monitoring power consumption of a device in order to determine a current backup energy requirement comprising an amount of energy needed to power the device for data-backup and power-down operations in the event of an interruption of main power to the device. Based on the current backup energy requirement, one or more of a plurality of backup capacitors of the device may be turned on or off, wherein the plurality of backup capacitors are configured such that those of the plurality of backup capacitors remaining in the on state provide backup energy to the device during the interruption of main power.

According to further embodiments, a computer-readable storage medium contains processor-executable instructions configured to cause the controller of a storage device to receive power consumption data related to the storage device from a power monitor component and determine a current backup energy requirement for the storage device based on the power consumption data. The controller may then turn on or off one or more of a plurality of backup capacitors of the storage device based on the current backup energy requirement. The receiving, determining, and turning on or off are repeated by the controller on a periodic basis. If a power failure in the storage device is detected by the controller, the controller performs data-backup and power-down operations while those of the plurality of backup capacitors remaining in an on state power the storage device.

According to further embodiments, a solid-state drive ("SSD") apparatus comprises a controller, a power connector connecting a power circuitry of the SSD apparatus to a host device and providing power from the host device to the SSD apparatus, a power monitor interposed between the power connector and other components of the SSD apparatus and configured to monitor power consumption of the SSD apparatus and provide power consumption data to the controller, a plurality of backup capacitors connected to the power circuitry and configured to provide backup energy to the SSD apparatus in the event of an interruption of the power to the SSD apparatus from the host device, and a plurality of switching components configured to be controlled by the controller and to switch a corresponding one of the plurality of the backup capacitors into or out of a power circuitry of the SSD apparatus. The controller is configured to receive the power consumption data from the power monitor and determine a current backup energy requirement for the SSD apparatus based at least in part on the power consumption data. The current backup energy requirement represents an amount of energy needed to power the SSD apparatus for data-backup and power-down operations in the event of the interruption of the power from host device. Based on the current backup energy requirement, the controller may switch one or more of the plurality of backup capacitors into or out of the power circuitry of the SSD apparatus. The controller repeats the receiving, determining, and switching steps on a periodic basis.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

FIG. 3 is a data structure diagram showing some parameters used in the intelligent management of backup capacitors, according to embodiments described herein.

DETAILED DESCRIPTION

Figure 1:
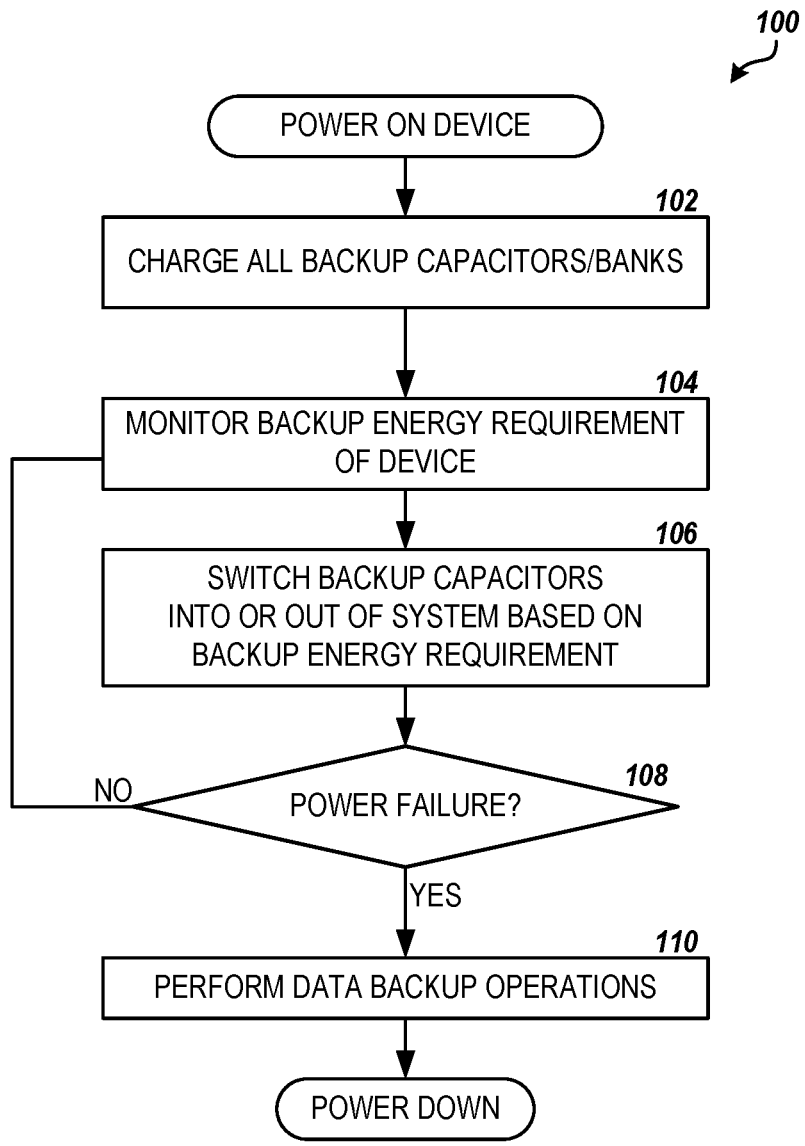
FIG. 1 is a flow diagram showing one method for intelligently managing backup capacitors in a storage device in order to prolong capacitor life, according to embodiments described herein.

The following detailed description is directed to methods, apparatuses, and systems for intelligently managing backup capacitors in a storage device, such as a solid-state drive ("SSD"), in order to prolong backup capacitor life. Backup capacitors (referred to herein interchangeably as "backup capacitors," "backup caps," "backup capacitors/banks," and the like) in SSDs and other storage devices are used for information backup during interruption of power to the device. The backup capacitors provide enough energy for completion of pending write transactions to the storage channel (such as pending NAND transactions) and perform a safe power-down. In an SSD, these data-backup and power-down operations may require only milliseconds to complete.

The capacitance of the backup capacitors or capacitor banks is typically designed based on the worst case, peak operating power requirements of the storage device. In addition, the backup capacitors/banks added to a system may provide excess capacity over the peak requirement so that there is still adequate power for backup operations and shutdown at peak power requirements even when one or more capacitors/banks fail. In conventional storage devices, the backup capacitors are "always on" during the entire operating time of the storage device, and this extended "on-time" may reduce the reliability of the backup capacitors over the lifetime of the device.

Utilizing the embodiments described herein, an SSD or other storage device incorporating backup capacitors or capacitor banks may be implemented in which the backup capacitors/banks are switched into and out of the system based on the power requirements of the storage device at any given time, thereby increasing the reliability of the backup capacitors. The amount of energy required to effect data-backup and power-down operations in the event of a power loss depends on the operating power of the device at the moment of power loss. As the device is not always working at peak operating power during its lifetime, there is no need for continuously charging all the backup capacitors all the time.

According to embodiments, a power monitor may be implemented in the SSD or other storage device to measure the power consumption of the device controller and storage channel. Instead of all the backup capacitors/banks being connected during operation of the device, as in a conventional storage device, the backup capacitors/banks are switched into or out of the system based on real-time power consumption details from the power monitor. If the power consumption is less than peak, fewer capacitors/banks may be "turned on," i.e., switched into the power circuitry of the device, with the remaining capacitors being "turned off," i.e., switched out of the power circuitry. This considerably reduces the overall operating time of (and stress on) the capacitors thereby increasing the reliability of the device over its lifetime. In some instances, the lifetime of the device with reliable backup capacitance may be increased by 30-40%.

FIG. 1 illustrates one method of intelligently managing backup capacitors in a storage device, such as in an SSD device, in order to prolong capacitor life, according to some embodiments. The routine 100 may be performed during normal operation, or "user mode," of the device, for example. According to some embodiments, the routine 100 may be performed by a backup capacitor management module implemented in software and/or circuitry in the controller of the storage device. The routine 100 includes step 102, where upon power on of the device, all of the backup capacitors or capacitor banks of the device are charged to 100% capacity. According to some embodiments, switching a capacitor out of the power circuitry while fully charged further increases the reliability and lifetime of the capacitor. In other embodiments, some number of capacitors/banks may be turned on upon power-up and allowed to charge over time.

Next, at step 104, the power consumption of the storage device is monitored during normal operation in order to determine the backup energy required to perform data-backup and power-down operations. In some embodiments, the backup energy requirement may be determined from the current power consumption of the device as measured at the power input. For example, the backup time T for an SSD device may be determined during the design of the device and may range from a few milliseconds to few seconds. If the instantaneous power consumption $P_{INST}$ of the device, obtained from a power monitor at the power input, then the current backup energy requirement $E_{REQ}$ may be calculated as $E_{REQ}=P_{INST}*T$. In other embodiments, the backup energy requirement of the device may be calculated based on one or more of the current power consumption of the device, the rate of operations being handled by the device, the number of NAND operations in a cache of the device, and the like.

According to some embodiments, the backup energy requirement of the device may be determined on a periodic basis. For example, the backup energy requirement of the device may be determined every 1 to 5 µs in order to provide substantially real-time adjustment of capacitance available for backup power for the device. This may be desirable in storage devices with multi-core processors where one core is less frequently used and can be made available for near-continuous monitoring of the backup energy requirements of the device. In other examples, backup energy requirements may be determined less frequently, such as one to several times per day. This may be desirable is situations where the power requirements of the device remain relatively constant. In other embodiments, the frequency with which the backup energy requirement of the device is determined may vary based on the operating conditions of the device. For example, the backup energy requirement of the device may be determined at a first interval, such as every 1 to 5 µs, while there is activity within the controller of the device. When no activity in the controller is detected, the backup energy requirement may be determined at a less frequent interval, e.g., once every second. It will be appreciated by one skilled in the art that any period may be used for determining backup energy requirements, and it is intended that all such periods be included within the scope of the present disclosure.

The routine 100 proceeds to step 106, where one or more of the backup capacitors/banks in the device are turned on or off, i.e., switched into or out of the power circuitry of the storage device, based on the backup energy requirement of the device. According to embodiments, the backup capacitors of the storage device may be divided into individual capacitors or banks of capacitors, each capacitor/bank having a known energy storage capacity. If a backup capacitor/bank has total capacitance C, then the backup energy $E_{BC}$ provided by the backup capacitor may be calculated by $E_{BC}=0.5*C*V^2$, where V is the voltage across the capacitor. For example, for a maximum backup energy requirement N, the backup capacitors of the storage device may be divided into 4 capacitors/banks comprising energy storage capacity of ½ N, ½ N, ¼ N, and ¼ N. Each individual capacitor/bank is capable of being switched into and out of the power circuitry of the storage device by the controller.

Based on the backup energy requirement $E_{REQ}$ of the device calculated in step 104, the controller may turn one or more of the individual capacitors/banks on or off. For example, the total backup energy $E_{TOTAL}$ available may be obtained by summing the individual backup energies $E_{BC}$ of all backup capacitors currently in the on state. As long as $E_{TOTAL}>E_{REQ}$, there should be sufficient backup energy is available to effect data backup and power down upon a power failure, while preventing unneeded capacitors/banks from remaining in a constant charging cycle, thereby increasing their lifespan. According to some embodiments, the disconnected capacitors are left open with a full charge. If the maximum backup energy requirement is needed, then all the backup capacitors/banks will be turned on. In further embodiments, the individual capacitors/banks that are turned on or off may also be based on a rotating schedule configured so that the time in the on state (constantly charging) for the each individual capacitor/bank is substantially equalized, thus further increasing the reliability of the backup capacitors and the lifetime of the storage device.

As is shown in FIG. 1, the process of monitoring the backup energy requirement and switching the appropriate backup capacitors/banks on or off is continuously repeated during normal operation of the storage device. If, however, a power failure occurs, as shown at step 108, the routine 100 proceeds to step 110, where the storage device performs the required data backup operations. This may include processing all cached NAND operations in an SSD, for example. In other storage devices, this may include flushing the write cache to the recording medium. According to embodiments, the storage device will have sufficient energy from the currently on backup capacitors/banks in order to complete the data backup operations and to effect a graceful power-down of the device will all data secured. From step 110, the routine 100 ends.

Figure 2:
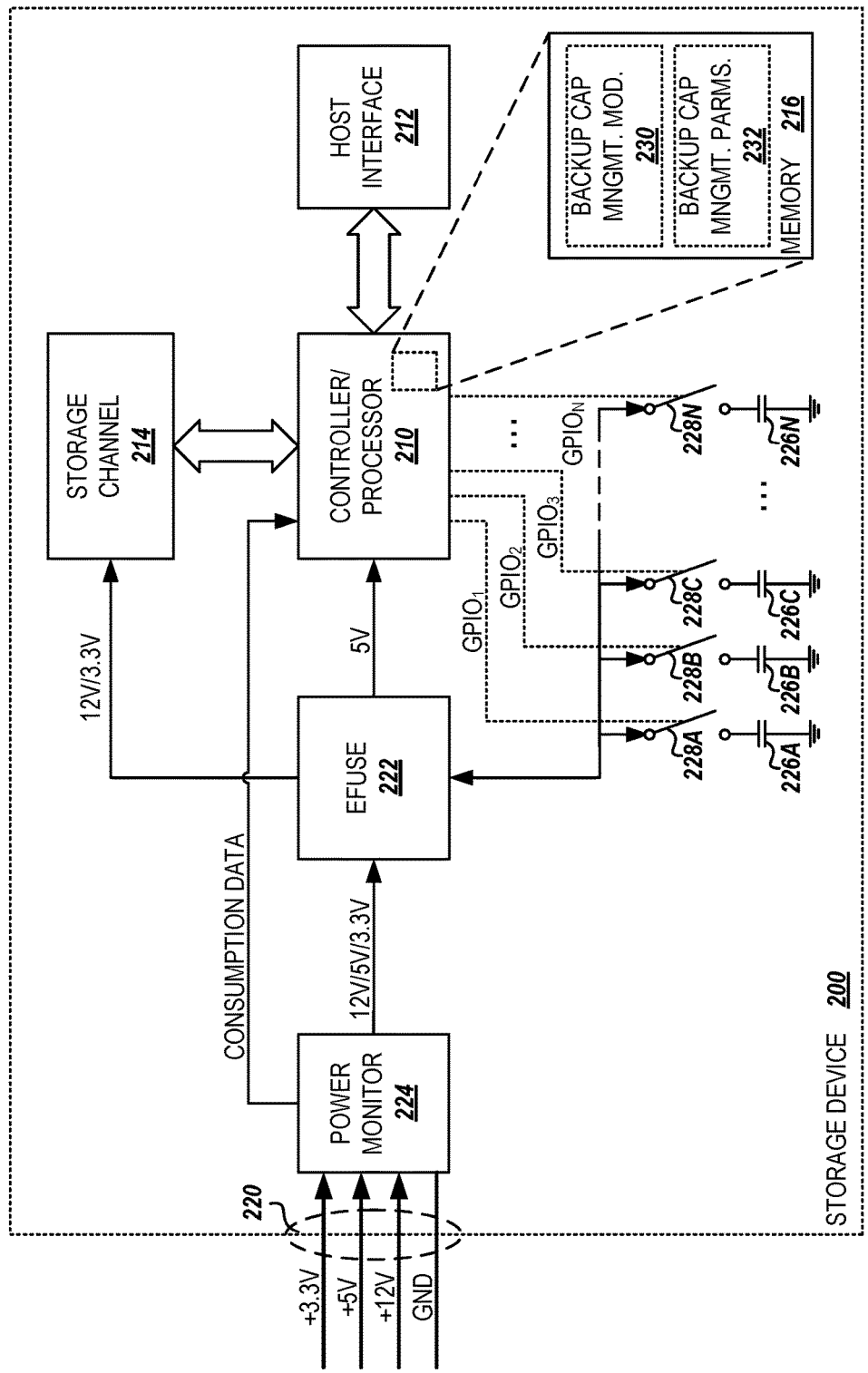
FIG. 2 is a block diagram showing an illustrative storage device for the intelligent management of backup capacitors, according to embodiments described herein.

FIG. 2 and the following description are intended to provide a general description of a suitable environment in which the embodiments described herein may be implemented. In particular, FIG. 2 shows an illustrative storage device 200, such as an SSD device, along with hardware, software and components for intelligently managing backup capacitors in the device, according to the embodiments provided herein. The storage device 200 may include a controller/processor 210 that controls the operations of the storage device. The storage device 200 may further include a host interface 212 that allows the storage device 200 to communicate with a host device or other components, such as a server computer, personal computer ("PC"), laptop, tablet, game console, set-top box or any other electronics device that can be communicatively coupled to the storage device 200 to store and retrieve data from the storage device. The controller 210 may process read/write commands from the host device through a storage channel 214 which may comprise solid-state media, magnetic media, optical media, and/or any combination of these and other data storage media known in the art.

The controller/processor 210 may further include a computer-readable storage medium or "memory" 210 for storing processor-executable instructions, data structures and other information. The memory 210 may comprise a non-volatile memory, such as read-only memory ("ROM") and/or FLASH memory, and a random-access memory ("RAM"), such as dynamic random access memory ("DRAM") or synchronous dynamic random access memory ("SDRAM"). The memory 210 may further comprise a portion of the storage media in the storage channel 214 of the storage device 200. For example, the memory 216 may store a firmware that comprises commands and data necessary for performing the operations of the storage device 200. According to some embodiments, the memory 216 may store processor-executable instructions that, when executed by the processor, perform some or all of the steps 102-110 of the routine 100 for intelligently managing backup capacitors in the storage device 200, as described herein.

In addition to the memory 216, the environment may include other computer-readable media storing program modules, data structures and other data described herein for sharing power load across multiple voltage supplies in the storage device 200. It will be appreciated by those skilled in the art that computer-readable media can be any available media that may be accessed by the controller/processor 210 or other computing system, including computer-readable storage media and communications media. Communications media includes transitory signals. Computer-readable storage media includes volatile and non-volatile, removable and non-removable storage media implemented in any method or technology for the non-transitory storage of information. For example, computer-readable storage media includes, but is not limited to, RAM, ROM, erasable programmable ROM ("EPROM"), electrically-erasable programmable ROM ("EEPROM"), FLASH memory or other solid-state memory technology, compact disc ROM ("CD-ROM"), digital versatile disk ("DVD"), high definition DVD ("HD-DVD"), BLU-RAY or other optical storage, magnetic cassettes, magnetic tape, magnetic disk storage or other magnetic storage devices and the like.

The storage device 200 may be provided power for operation by the host device through a standard power connector 220, such as a SATA power connector, a Molex® power connector, a serial-attached SCSI ("SAS") connector, or the like. In some embodiments, the host may provide the power circuitry of the storage device 200 with multiple voltages in order to operate various components of the device. For example, an SSD storage device 200 may utilize +5V provided at the SATA power connector 220 to operate the controller/processor 210 and +3.3V to operate the NAND flash memory in the storage channel 214. According to some embodiments, the power circuitry of the storage device 200 includes an electronic-fuse circuit, or efuse 222, to distribute power to the various components as well as protect the components of the device from damage caused by the power supply and enable backup power during power failure using the backup capacitors, as described herein.

According to further embodiments, the power circuitry of the storage device 200 further includes a power monitor 224 that can monitor the instantaneous power consumption of the storage device 200. In some embodiments, the power monitor 224 may comprise circuitry implemented in the efuse 222 or incorporated between the efuse 222 and the power connector 220. The power monitor 224 may be configured to provide power consumption data to the controller/processor 210 for the management of the backup capacitors, as described herein.

The power circuitry of the storage device 200 further includes a number of backup capacitors 226A-226N (referred to herein generally as backup capacitors 226). Each individual backup capacitor, such as backup capacitor 226A, may comprise an individual capacitor component or a bank of capacitor components connected in parallel and is designed to store a predetermined amount of energy. The capacitor components may comprise tantalum capacitors, niobium capacitors, supercapacitors, and/or any combination of these and other capacitor components known in the art. The energy storage capacity of each backup capacitor 226A-226N may be selected to provide adequate and resilient backup energy upon interruption of power to the storage device 200 but to minimize switching controls utilized in management of the capacitors, as described below. For example, for a maximum backup energy requirement N, the storage device may contain 4 backup capacitors 226 comprising energy storage capacity of ½ N, ½ N, ¼ N, and ¼ N, respectively. This provides for 150% of the maximum backup energy requirement while limiting the number of individual backup capacitors 226 to four, thus only requiring four switching components for intelligent management of the backup capacitors according to embodiments described herein. It will be appreciated that the type, number, capacity, and configuration of the backup capacitors 226 is not intended to be limited by this disclosure, and may be the result of design choices made during the design and manufacturer of the storage device 200 or of a class of storage devices based on the power requirements of the device, the type of storage channel 214 employed by the device, the number and types of operations cached by the device, and/or the like.

According to embodiments, each backup capacitor 226A-226N may be switched into or out of the power circuitry of the storage device 200, also referred to herein as being "turned on" or "turned off," respectively, by a corresponding switching component 228A-228N (referred to herein generally as switching component 228). The switching components 228 may comprise solid-state relays, transistors, and/or the like for connecting or disconnecting the corresponding backup capacitor 226A-226N to a power bus for charging and discharging of the backup capacitor(s). In some embodiments, the switching components 228 may be controlled by the controller/processor 210 of the storage device. For example, the controller/processor 210 may utilize available general purpose I/O (GPIO) pins for control of the switching components 228, either directly or through a multiplexer circuit (MUX) (not shown). In other embodiments, the switching components 228 may be controlled by dedicated circuitry.

In further embodiments, the storage device may include a backup capacitor management module 230. The backup capacitor management module 230 may perform the methods and processes described herein for intelligently managing the backup capacitors 226 of the storage device 200 in order to prolong capacitor reliability and lifespan. For example, on a periodic basis, the backup capacitor management module 230 may receive power consumption data from the power monitor 224, calculate the instantaneous backup energy requirement of the storage device 200 based at least in part of the power consumption data, and then utilize the switching components 228 to switch the appropriate backup capacitors 226 on or off based on the current backup energy requirement of the device. According to some embodiments, the backup capacitor management module 230 may be implemented as software for execution in the controller/processor 210 and stored in the memory 216 as part of the firmware of the storage device 200. In further embodiments, the backup capacitor management module 230 may be implemented in a combination of hardware components in the power circuitry of the storage device 200 and software in the controller/processor 210.

The backup capacitor management module 230 may utilize various backup capacitor management parameters 232 for the intelligent management of the backup capacitors 226. The backup capacitor management parameters 232 may be stored in the memory 216 of the storage device 200, according to some embodiments. For example, as shown in FIG. 3, the backup capacitor management parameters 232 may comprise a number of backup energy requirement thresholds 302A-302N (referred to herein generally as backup energy requirement thresholds 302). Each backup energy requirement threshold 302 may specify a backup energy requirement threshold value and a specification of a number or size of the backup capacitors 226 that must be turned on by the backup capacitor management module 230 in order to satisfy the backup energy requirement. When the current backup energy rises above and/or drops below the threshold value, the specified backup capacitors may be turned on or off accordingly to ensure sufficient backup energy is available to the storage device 200 in the event of an interruption of power to the device.

The backup capacitor management parameters 232 may further comprise a backup capacitor rotation schedule 304. The backup capacitor rotation schedule 304 may specify a rotation schedule for the backup capacitors 226 that is utilized by the backup capacitor management module 230 to switch different backup capacitors/banks on or off for the various backup energy requirement thresholds 302 so that no one backup capacitor remains in the on state, i.e., constantly charging, for most of the time, thereby equalizing the lifespan of the various backup capacitors. For example, the time in the "on state," also referred to as the charging time, of each individual backup capacitor 226 may be monitored by a counter. If the counter for an individual backup capacitor exceeds some threshold time value T, the backup capacitor may be turned off and the next backup capacitor(s) of equivalent energy capacity may be turned on. The timer for that backup capacitor may then be reset. This charging time information for the backup capacitors 226 may be stored along with other backup capacitor management parameters 232 in a non-volatile section of the memory 216 of the controller 210, for example. Periodic reading and updating of the charging time information may be used to select the backup capacitors to turn on based on the instantaneous power consumption of the device, thus equalizing the lifespan of the backup capacitors. It will be appreciated that many other backup capacitor management parameters 232 may be additionally or alternatively utilized by the backup capacitor management module 230 to intelligently manage the backup capacitors 226 beyond those shown in the figures and described herein.

Returning to FIG. 2, it will be appreciated that the structure and/or functionality of the storage device 200 may be different that that illustrated in the figure and described herein. For example, the controller/processor 210, host interface 212, parts of the storage channel 214, memory 216, efuse 222, power monitor 224, backup capacitors 226, switching components 228, and other components and circuitry of the storage device 200 may be integrated within a common integrated circuit package, such as a system-on-a-chip ("SoS"), or they may be distributed among multiple integrated circuit packages. Similarly, the illustrated connection pathways are provided for purposes of illustration and not of limitation, and some components and/or interconnections may be omitted for purposes of clarity. It will be further appreciated that the storage device 200 may not include all of the components shown in FIG. 2, may include other components that are not explicitly shown in FIG. 2 or may utilize an architecture completely different than that shown in FIG. 2.

Simulations indicate that, utilizing the technologies described herein, the utilization rate (time in the on/charging/discharging state) for any one backup capacitor 226 in a typical enterprise SSD device can be decreased to as low as 35%, although the actual utilization rate may depend on the implementation and efficiency of the intelligent management and backup capacitor rotation algorithms. This will result in increased reliability for single backup capacitors and correspondingly the backup capacitor bank(s). In addition, the components described herein can be added to existing drive designs and architectures without any degradation or change in the performance or operation of the drive.

Based on the foregoing, it will be appreciated that methods and apparatuses for intelligently managing backup capacitors in a storage device in order to prolong capacitor life are presented herein. While the embodiments shown herein are described in reference to a storage device, and more specifically to an SSD, it will be appreciated that the methods, apparatuses, and systems described herein may be utilized with any device that uses backup capacitors for backup power during an interruption in the main power source for the device. This includes hard disk drive ("HDD") devices, solid-state hybrid drive ("SSHD") devices, optical storage devices, communication and networking devices, server computer devices, and the like. It is intended that all such devices be included within the scope of the present disclosure.

The logical steps, functions, or operations described herein as part of a method, process or routine may be implemented (1) as interconnected digital circuits or components and/or (2) as a sequence of processor-implemented acts, software modules, or portions of code running on a controller or computing system. The implementation is a matter of choice dependent on the performance and other requirements of the system. Alternate implementations are included in which operations, functions or steps may not be included or executed at all, may be executed out of order from that shown or discussed, including substantially concurrently or in reverse order, depending on the functionality involved, as would be understood by those reasonably skilled in the art of the present disclosure.

It will be further appreciated that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Many variations and modifications may be made to the above-described embodiments without departing substantially from the spirit and principles of the present disclosure. Further, the scope of the present disclosure is intended to cover any and all combinations and sub-combinations of all elements, features, and aspects discussed above. All such modifications and variations are intended to be included within the scope of the present disclosure, and all possible claims to individual aspects or combinations of elements or steps are intended to be supported by the present disclosure.

What is claimed is:

1. A method comprising steps of:
monitoring instantaneous power consumption of a device during normal operation of the device;
determining a current backup energy requirement for the device based on the instantaneous power consumption of the device, the current backup energy requirement comprising an amount of energy needed to power the device for data-backup and power-down operations in the event of an interruption of power to the device; and
turning one or more of a plurality of backup capacitors of the device on or off based on the current backup energy requirement of the device, wherein the plurality of backup capacitors are configured such that those of the plurality of backup capacitors in an on state provide backup energy to the device in the event of an interruption of power to the device.

2. The method of claim 1, further comprising the steps of:
upon power-up of the device, charging each of the plurality of backup capacitors to full charge.

3. The method of claim 1, wherein the monitoring, determining, and turning steps are repeated on a periodic basis.

4. The method of claim 1, wherein the monitoring, determining, and turning steps are performed substantially continuously.

5. The method of claim 1, wherein the one or more of the plurality of the backup capacitors are turned on and off based in part on a backup capacitor rotation schedule configured for the device.

6. The method of claim 1, wherein turning one or more of a plurality of backup capacitors of the device on or off based on the backup energy requirement of the device comprises:
upon detecting that the current backup energy requirement drops below a first threshold, turning off a subset of the plurality of backup capacitors in the device; and
upon detecting that the current backup energy requirement rises above the first threshold, turning on the subset of the plurality of backup capacitors in the device.

7. The method of claim 1, wherein the device comprises a solid-state drive ("SSD") device.

8. The method of claim 1, wherein each of the plurality of backup capacitors are turned on or off by way of a corresponding switching component controlled by a controller/processor of the device.

9. A non-transitory computer-readable storage medium containing processor-executable instructions configured to, when executed by a controller of a storage device, cause the controller to:
receive power consumption data related to the storage device during normal operation of the storage device from a power monitor component of the storage device;
determine a current backup energy requirement for the storage device based on the power consumption data, the current backup energy requirement comprising an amount of energy needed to power the storage device for data-backup and power-down operations in the event of an interruption of power to the storage device;
turn on or off one or more of a plurality of backup capacitors of the storage device based on the current backup energy requirement;
repeat the receiving, determining, and turning on or off on a periodic basis;
detect a power failure in the storage device; and
upon detecting the power failure, perform the data-backup and power-down operations while those of the plurality of backup capacitors remaining in an on state power the storage device.

10. The computer-readable storage medium of claim 9, containing further processor-executable instructions configured to cause the controller to:
upon power-up of the storage device, turn on all of the plurality of backup capacitors until each of the plurality of backup capacitors is fully charged.

11. The computer-readable storage medium of claim 9, wherein the receiving, determining, and turning on or off are repeated at a first interval when the controller detects activity in the storage device and are repeated at a second interval when the controller detects no activity in the storage device.

12. The computer-readable storage medium of claim 9, wherein the one or more of the plurality of the backup capacitors are turned on and off based in part on a backup capacitor rotation schedule configured for the storage device.

13. The computer-readable storage medium of claim 9, wherein turning one or more of a plurality of backup capacitors of the storage device on or off comprises:
upon detecting that the current backup energy requirement drops below a first threshold, turning off a subset of the plurality of backup capacitors; and
upon detecting that the current backup energy requirement rises above the first threshold, turning on the subset of the plurality of backup capacitors.

14. The computer-readable storage medium of claim 9, wherein the storage device comprises is a solid-state drive ("SSD").

15. The computer-readable storage medium of claim 9, wherein each of the plurality of backup capacitors are turned on or off by way of a corresponding switching component controlled by a controller of the storage device.

16. A solid-state drive ("SSD") apparatus comprising:
a controller;
a power connector connecting a power circuitry of the SSD apparatus to a host device and providing power from the host device to the SSD apparatus;
a power monitor interposed between the power connector and other components of the SSD apparatus and configured to monitor power consumption of the SSD apparatus and provide power consumption data to the controller;
a plurality of backup capacitors connected to the power circuitry and configured to provide backup energy to the SSD apparatus in the event of an interruption of the power to the SSD apparatus from the host device; and a plurality of switching components configured to be controlled by the controller and to switch a corresponding one of the plurality of the backup capacitors into or out of a power circuitry of the SSD apparatus, wherein the controller is configured to receive the power consumption data from the power monitor, determine a current backup energy requirement for the SSD apparatus based at least in part on the power consumption data, the current backup energy requirement comprising an amount of energy needed to power the SSD apparatus for data-backup and power-down operations in the event of the interruption of the power from host device, switch one or more of the plurality of backup capacitors into or out of the power circuitry of the SSD apparatus based on the current backup energy requirement, and repeat the receiving, determining, and switching a periodic basis.

17. The SSD apparatus of claim 16, wherein the controller is further configured to:

detect the interruption of the power from host device; and upon the interruption of the power from host device, perform the data-backup and power-down operations while those of the plurality of backup capacitors remaining switched into the power circuitry power the SSD apparatus.

18. The SSD apparatus of claim 16, wherein at least one of the plurality of backup capacitors comprises a bank of capacitors.

19. The SSD apparatus of claim 16, wherein the receiving, determining, and switching are repeated at a first interval when the controller detects activity in the SSD apparatus and are repeated at a second interval when the controller detects no activity in the SSD apparatus.

20. The SSD apparatus of claim 16, wherein switching the one or more of the plurality of the backup capacitors into or out of the power circuitry is further based on a backup capacitor rotation schedule configured for the SSD apparatus.

* * * * *